United States Patent
Park et al.

(10) Patent No.: US 12,249,719 B2
(45) Date of Patent: Mar. 11, 2025

(54) ELECTRODE STRUCTURE COMPRISING POTENTIAL SHEATH FOR SECONDARY BATTERY AND FABRICATION METHOD THEREFOR

(71) Applicant: Industry-University Cooperation Foundation Hanyang University, Seoul (KR)

(72) Inventors: Won Il Park, Seoul (KR); Won Jun Chang, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 18/195,710

(22) Filed: May 10, 2023

(65) Prior Publication Data

US 2023/0361310 A1 Nov. 9, 2023

Related U.S. Application Data

(62) Division of application No. 17/045,026, filed as application No. PCT/KR2019/004015 on Apr. 4, 2019, now Pat. No. 11,688,856.

(30) Foreign Application Priority Data

Apr. 4, 2018 (KR) .................. 10-2018-0039315

(51) Int. Cl.
H01M 4/62 (2006.01)
C23C 16/42 (2006.01)
(Continued)

(52) U.S. Cl.
CPC ............ *H01M 4/628* (2013.01); *C23C 16/42* (2013.01); *H01M 4/0428* (2013.01);
(Continued)

(58) Field of Classification Search
CPC .... H01M 4/628; H01M 4/0428; H01M 4/136; H01M 4/1397; H01M 4/62
See application file for complete search history.

(56) References Cited

U.S. PATENT DOCUMENTS

2014/0072871 A1 3/2014 Chen et al.
2016/0315326 A1 10/2016 Shin et al.

FOREIGN PATENT DOCUMENTS

KR 10-2015-0072103 A 6/2015
KR 10-2016-0125171 A 10/2016
(Continued)

OTHER PUBLICATIONS

Won Jun Chang, et al., "Silicide-nanowire Anchored on Inner Surface of Graphene Foam as Anode Materials for Li-ion Battery", NEP Lab., Div. of MSE, Hanyang University, pp. 1-18, Aug. 2018.
Runwei Mo, et al., "3D nitrogen-doped graphene foam with encapsulated germanium/nitrogen-doped graphene yolk-shell nanoarchitecture for high-performance flexible Li-ion battery", Article, Nature Communications, Jan. 4, 2017, pp. 1-9.
(Continued)

*Primary Examiner* — Kenneth J Douyette
(74) *Attorney, Agent, or Firm* — Sughrue Mion, PLLC

(57) ABSTRACT

An electrode structure for a secondary battery includes a potential sheath capable of suppressing a side reaction between an electrode and an electrolyte through electric potential control. The electrode structure for the secondary battery uses the electric potential control so that an unstable SEI layer, which causes decrease in cycle characteristic and capacity of an anode material, occurs only on the surface of a potential sheath without occurring on the surface of the anode active material, thereby being capable of completely solving the problems of the existing nanostructured electrode. A method for manufacturing an electrode for a secondary battery includes the steps of: (a) preparing a template form; (b) coating a graphene on the template foam; (c) removing the template foam to form a graphene foam, wherein the template foam partially remains on an internal surface of the graphene foam; and (d) growing a nanowire (Continued)

by using the template foam remaining on the internal surface of the graphene foam as a seed.

7 Claims, 16 Drawing Sheets

(51) Int. Cl.
    *H01M 4/04*         (2006.01)
    *H01M 4/13*         (2010.01)
    *H01M 4/136*       (2010.01)
    *H01M 4/1397*     (2010.01)
    *H01M 10/0525*    (2010.01)
    *H01M 4/02*         (2006.01)

(52) U.S. Cl.
    CPC ......... *H01M 4/136* (2013.01); *H01M 4/1397* (2013.01); *H01M 2004/028* (2013.01); *H01M 10/0525* (2013.01)

(56) References Cited

FOREIGN PATENT DOCUMENTS

| KR | 10-1683391 B1 | 12/2016 |
| KR | 10-2017-0104235 A | 9/2017 |
| WO | 2013/066269 A1 | 5/2013 |
| WO | 2013/180661 A1 | 12/2013 |

OTHER PUBLICATIONS

Ziyang Lu, et al., "In situ growth of Si nanowires on graphene sheets for Li-ion storage", Electrochimica Acta, 2012, pp. 176-181, vol. 74.

Won Jun Chang, et al., "Controlling electric potential to inhibit solid-electrolyte interphase formation on nanowire anodes for ultra-fast lithium-ion batteries", Nature Communications, Aug. 2018, pp. 1-8, vol. 9, Article No. 3461.

Nian Liu, et al., "A pomegranate-inspired nanoscale design for large-volume-change lithium battery anodes", nature nanotechnology, Feb. 16, 2014, pp. 187-192.

International Search Report for PCT/KR2019/004015 dated Jul. 8, 2019 [PCT/ISA/210].

Written Opinion for PCT/KR2019/004015 dated Jul. 8, 2019 [PCT/ISA/237].

[Fig. 2]
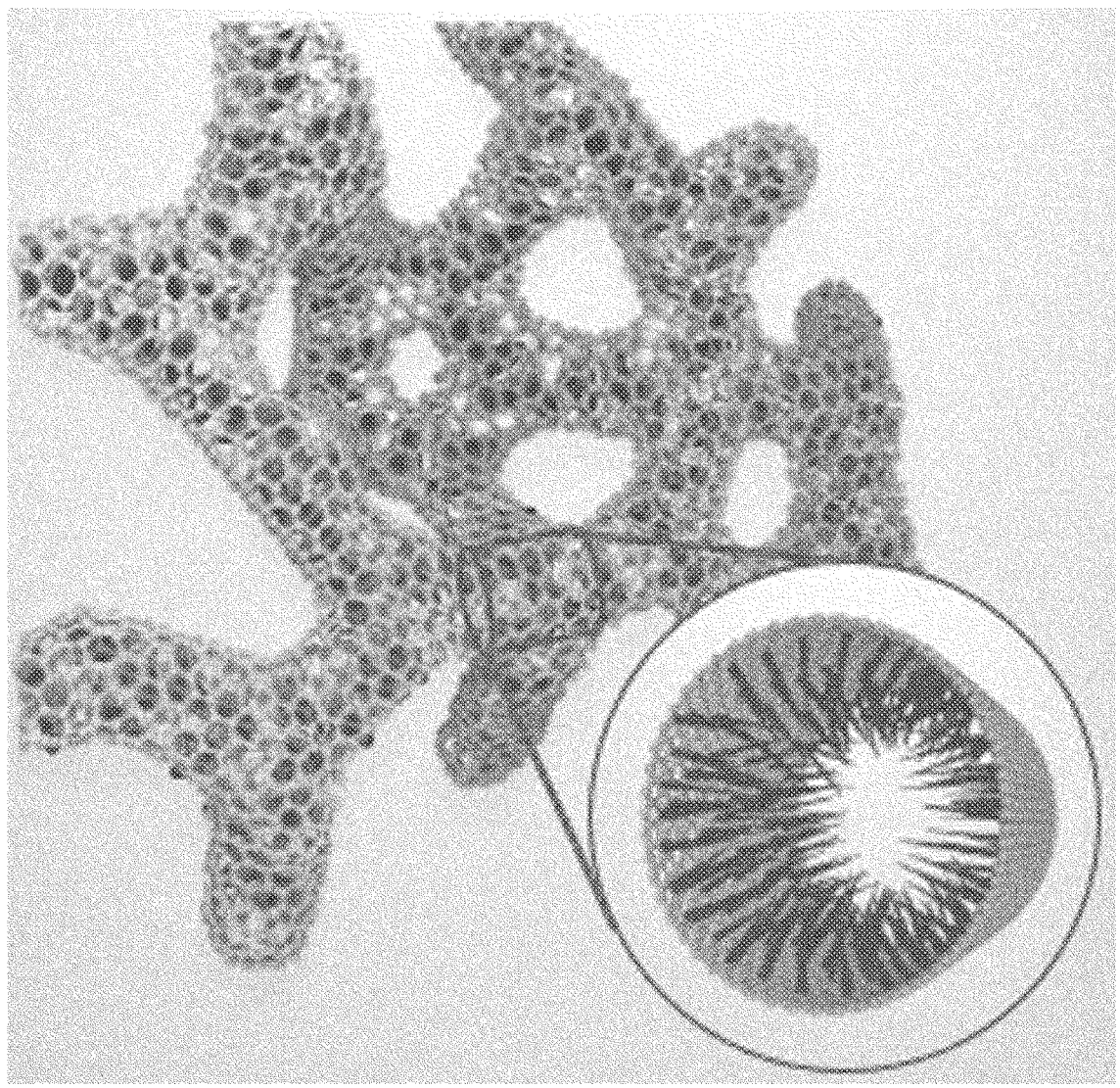

[Fig. 3]
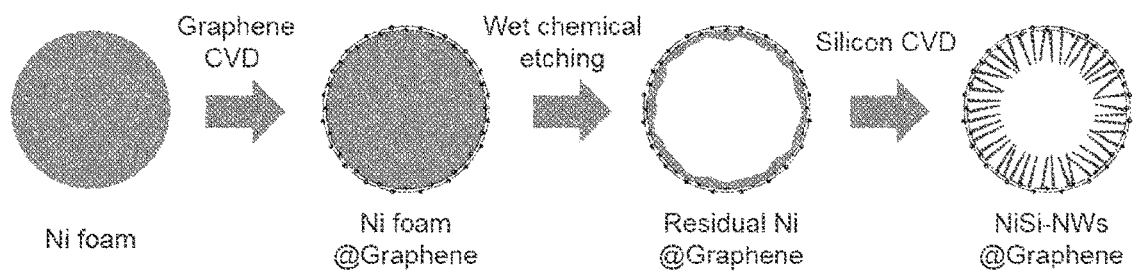

[Fig. 4]
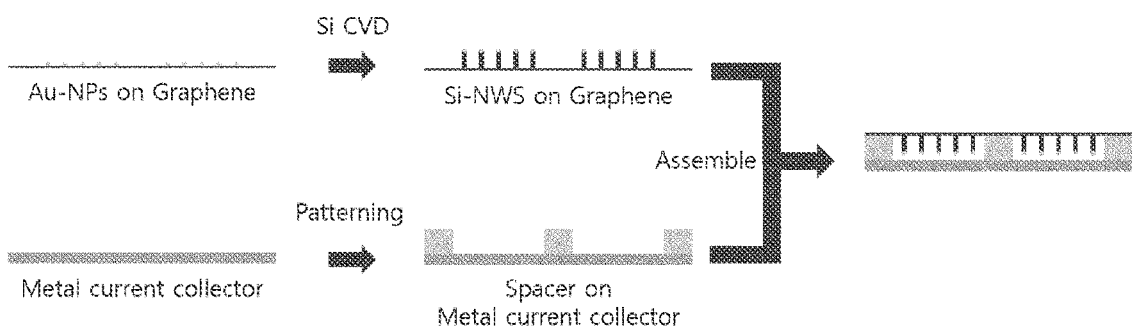

[Fig. 9]
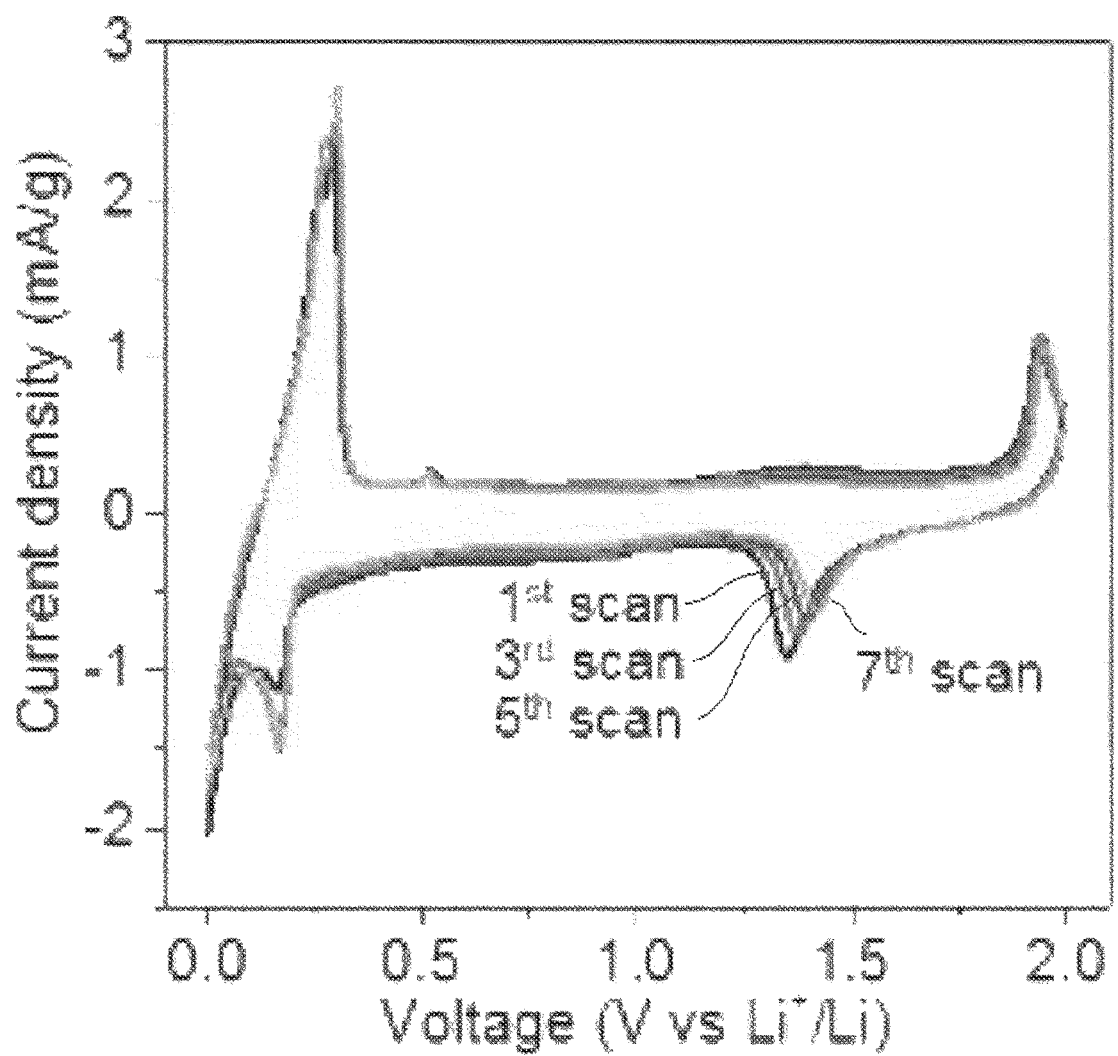

[Fig. 10]
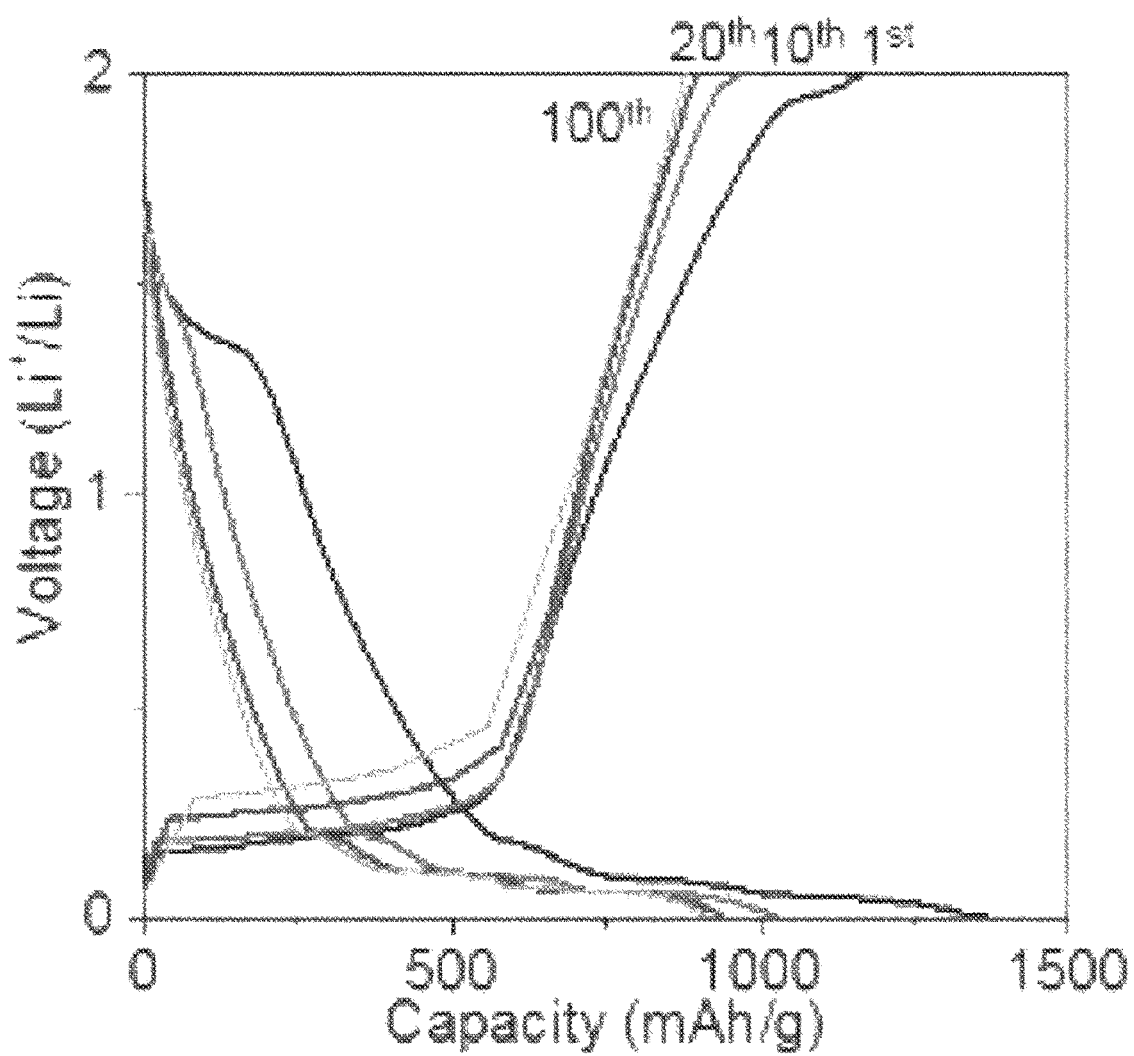

[Fig. 11]
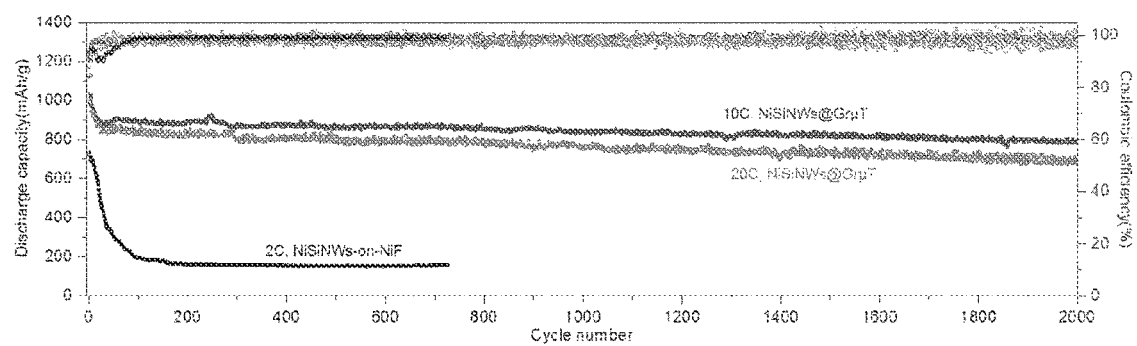

[Fig. 12]
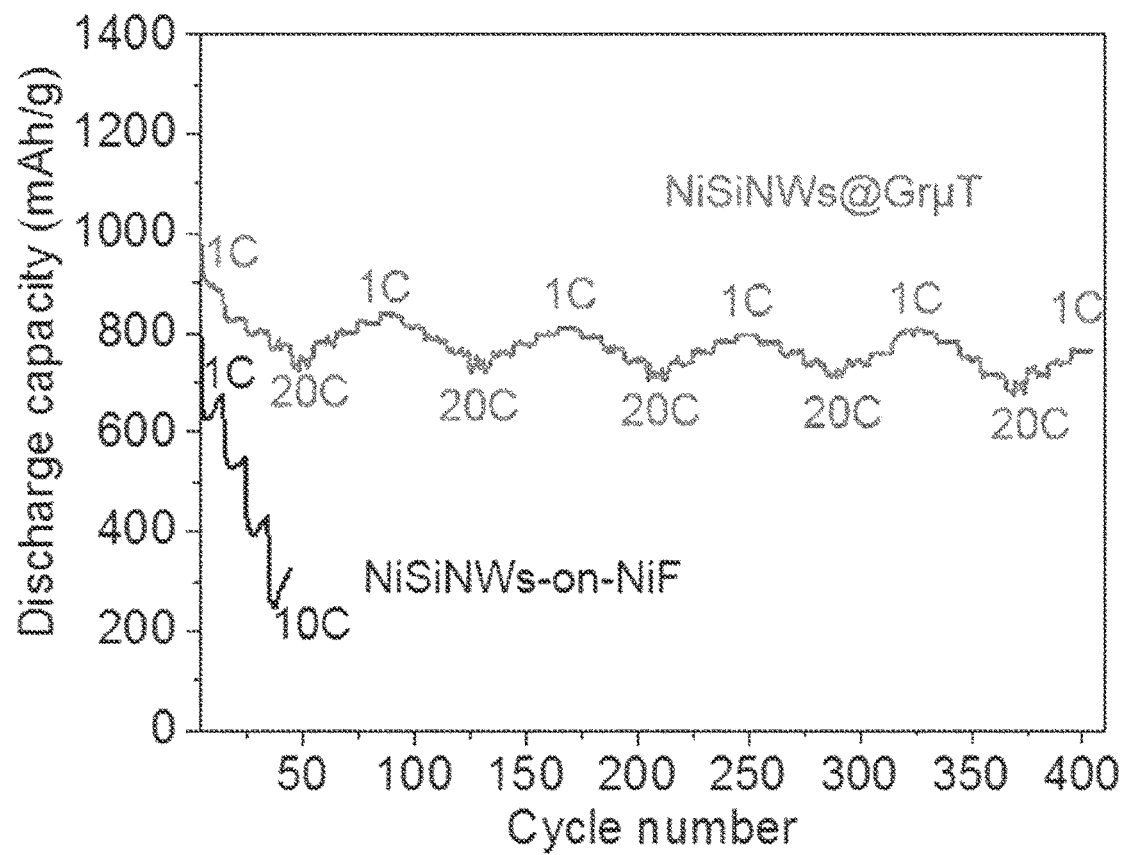

[Fig. 13]
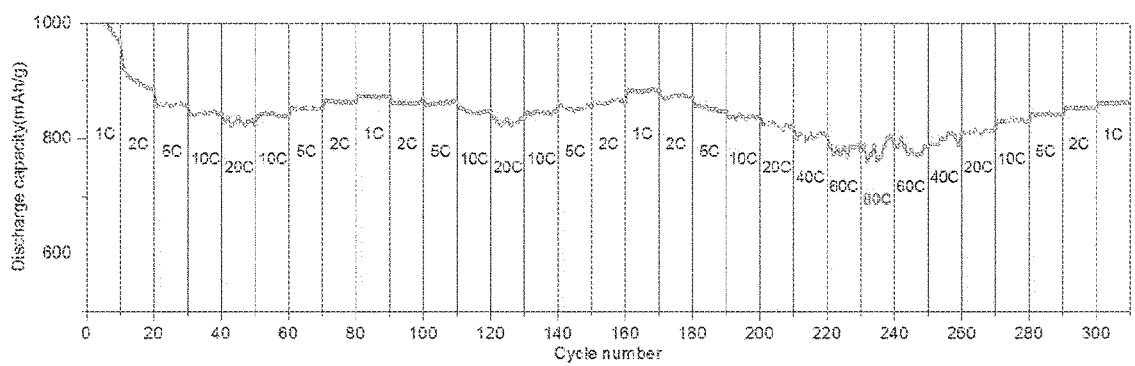

Fig. 15A
Fig. 15B
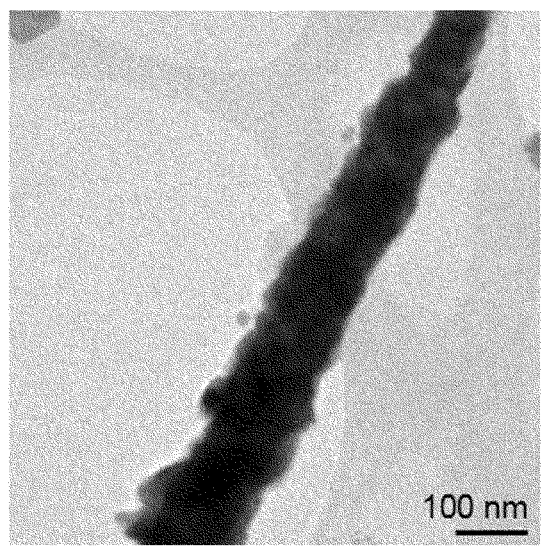
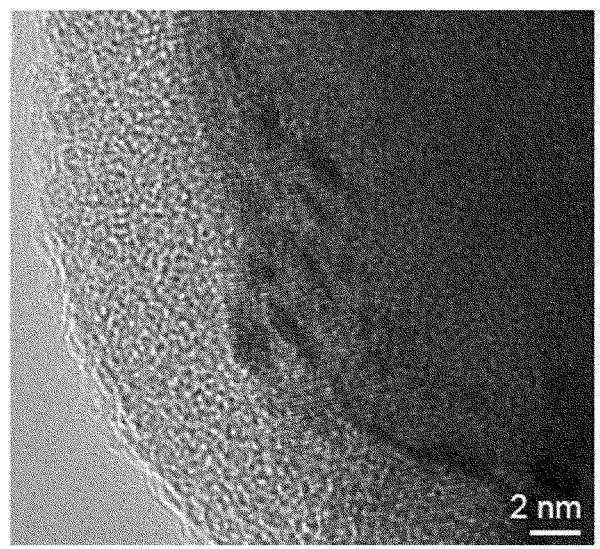

ELECTRODE STRUCTURE COMPRISING POTENTIAL SHEATH FOR SECONDARY BATTERY AND FABRICATION METHOD THEREFOR

CROSS REFERENCE TO RELATED APPLICATIONS

This application is a Divisional application of U.S. application Ser. No. 17/045,026 filed Oct. 2, 2020, now U.S. Pat. No. 11,688,856, which is a National Stage of International Application No. PCT/KR2019/004015 filed Apr. 4, 2019, claiming priority based on Korean Patent Application No. 10-2018-0039315 filed Apr. 4, 2018, the contents of all of which are incorporated herein by reference in their entireties.

TECHNICAL FIELD

The present invention relates to an electrode structure for a secondary battery comprising a potential sheath and a method for manufacturing the same, and, more particularly, is directed to an electrode structure for a secondary battery comprising a potential sheath capable of suppressing a side reaction between an electrode and an electrolyte through electric potential control, and a method for manufacturing the same.

BACKGROUND OF THE INVENTION

With the recent progress of electronic technology, a small portable device having a high function has been developed, and miniaturization and weight reduction, that is, high densification of high energy, of a power source used in the device is required. As a battery having a high energy density, a secondary battery of a lithium ion has been widely used.

Graphite, an anode material for the lithium secondary battery that is currently most widely used, has advantages of high economy, reversibility, and excellent cycle characteristic, but has limitation as the anode material for the secondary battery of high capacity because of its low theoretical capacity (372 mAhg$^{-1}$).

A material that can replace such a graphite anode material includes a silicon, a tin, and a germanium, which are elements of the same group as a carbon constituting the graphite. Among them, the silicon can realize a high capacity (3700 mAhg$^{-1}$) that is about 10 times that of the graphite anode, has a low reaction potential (<0.4 V vs. Li/Li$^+$) with the lithium, and is present in a large amount on the earth so that it is very advantageous in terms of cost compared to the other replacement materials and is non-toxic.

However, when the silicon anode reacts with the lithium, it undergoes a large volume expansion of 3 times or more, and thus, an active material is desorbed from a current collector and a conductive material, thereby forming an unstable side reaction layer (Solid-electrolyte Interphase Layer; SEI Layer) at the interface between the electrode and the electrolyte. As a result, there is a problem that shows a rapid decrease in capacity due to formation of the unstable side reaction layer. Further, low electrical conductivity (10$^{-5}$ S/cm) of the silicon also causes the rapid decrease in capacity even upon charging and discharging with high rate.

In order to settle these problems, a study has been conducted to alleviate the volume expansion of the silicon and to improve the electrical conductivity of the silicon. For example, Korean Patent Laid-open Publication No. 10-2016-0125171 discloses an electrode structure for effectively reducing decrease in capacity due to a volume expansion by forming a silicon nanostructure in pores of a foam structure having a plurality of pores. In addition, Korean Patent Laid-open Publication No. 10-2017-0104235 introduces a technology for providing a secondary battery of high capacity using a silicon particle of a conductive single crystal which is coated with a metal nanoparticle and an ultra-thin metal film.

Such a nanostructure of the silicon had the effect of suppressing collapse of the electrode structure due to the volume expansion of the silicon, but still had a problem that the silicon makes a surface area in contact with the electrolyte wider, which results in making formation of the unstable SEI layer even worse.

As an alternative for the above problem, a method of blocking direct contact between the surfaces of an electrolyte and an anode material by introducing a barrier film of a ceramic or carbon material into separate nanoparticles has been proposed [see the literature (Mo et al., 3D nitrogen-doped graphene foam with encapsulated germanium/nitrogen-doped graphene yolk-shell nanoarchitecture for high-performance flexible Li-ion battery. *Nature Commun.* 8 (2017)), the literature (Liu, N. et al., A pomegranate-inspired nanoscale design for large-volume-change lithium battery anodes. *Nature Nanotech.* 9, 187-192 (2014)), etc.]. In this structure, a rigid sheath layer induces formation of a stable SEI layer by blocking direct contact between the electrolyte and the anode material, and contributes to stabilizing a cycle characteristic by providing an internal cavity in which the anode material can expand freely. However, the introduction of the barrier film into the separate nanoparticles has a drawback in that mobility of the lithium ion is rapidly degraded, which causes limitation in the high rate characteristic, and that stability is largely collapsed even with small cracks.

Accordingly, the inventors of the present invention have completed the present invention by introducing the concept of electric potential control to propose a new anode structure capable of suppressing formation of the unstable SEI layer on the surface of the anode material even when the surfaces of the electrolyte and the anode material directly contact.

SUMMARY OF THE INVENTION

A purpose of the present invention is to provide an electrode structure for a secondary battery comprising a potential sheath.

Another purpose of the present invention is to provide a method for manufacturing an electrode structure for a secondary battery comprising a potential sheath.

Still another purpose of the present invention is to provide a secondary battery using an electrode structure for secondary transfer comprising a potential sheath.

In order to achieve the above purposes, the present invention provides an electrode structure for a secondary battery comprising a potential sheath of electrical conductivity that separates an electrolyte into an external electrolyte in contact with a cathode and an internal electrolyte in contact with a nanostructure; and the nanostructure formed on a surface of the potential sheath on which the internal electrolyte is located, wherein a potential difference is formed on a surface of the potential sheath on which the external electrolyte is located when the battery is charged.

In the present invention, the potential sheath may be formed of a graphene, a carbon thin film, or a conductive polymer film.

In the present invention, the potential sheath may also be a graphene foam structure having a continuous three-dimensional micro-tubular structure.

In the present invention, the nanostructure may be made of a silicon (Si), a lithium (Li), a germanium (Ge), a tin (Sn), or an indium (In)-based material.

In the present invention, the nanostructure may be made of nickel silicide (NiSi).

In the present invention, the nanostructure may be a nanowire.

The present invention also provides a method for manufacturing an electrode for a secondary battery, comprising the steps of:
  (a) preparing a template form;
  (b) coating a graphene on the template foam;
  (c) removing the template foam to form a graphene foam, wherein the template foam partially remains on an internal surface of the graphene foam; and
  (d) growing a nanowire by using the template foam remaining on the internal surface of the graphene foam as a seed.

In the method of the present invention, the step (b) can be carried out by a chemical vapor deposition (CVD) method using a carbon as a source gas.

In the method of the present invention, the template foam may be a nickel foam.

In the method of the present invention, the step (d) may be characterized in that a silicon-based nanowire is grown by the chemical vapor deposition method using a silicon-based source gas.

The method of the present invention may further comprise a step of immersing a graphene-coated template foam in ethanol, methanol or acetone before performing the step (c).

The step (c) in the method of the present invention is preferably carried out such that the template foam remains 4 to 10 times the weight of the graphene foam.

The step (c) in the method of the present invention is preferably carried out such that the template foam remains a weight of 0.1 to 1.0 mg/cm$^2$ on the internal surface of the graphene foam.

The present invention also provides a method for manufacturing an electrode for a secondary battery, comprising the steps of:
  (a) forming a seed particle on a graphene substrate;
  (b) growing a nanowire using the seed particle;
  (c) forming a spacer on a metal current collector; and
  (d) bonding the graphene substrate on which the nanowire is grown and the metal current collector.

In the method of the present invention, the seed particle may be a gold nanoparticle.

In the method of the present invention, the step (b) may be characterized in that a silicon-based nanowire is grown by a chemical vapor deposition using a silicon-based source gas.

The present invention also provides a secondary battery comprising the electrode structure.

EFFECT OF THE INVENTION

The electrode structure for the secondary battery according to the present invention uses electric potential control so that an unstable SEI layer, which causes decrease in cycle characteristic and capacity of an anode material, occurs only on the surface of a potential sheath without occurring on the surface of the anode active material, thereby being capable of completely solving the problems of the existing nanostructured electrode.

The electrode structure of the present invention exhibits excellent cycle performance that is difficult to predict from the conventional nanowire electrode structure by virtue of a synergistic effect of the potential sheath and the nanowire anode active material, and has an effect that is stable upon charging and discharging with high rate and can exert stable performance even if small cracks occur on the potential sheath.

BRIEF DESCRIPTION OF THE DRAWINGS

FIG. 2 shows an exemplary anode structure of the present invention.

FIG. 3 is a process diagram for manufacturing the anode structure of FIG. 2.

FIG. 4 shows a method for manufacturing another exemplary electrode structure of the present invention.

FIG. 9 shows a CV (cyclic voltammetry) profile of a battery according to an embodiment of the present invention.

FIG. 10 shows a GCD (galvanostatic charge-discharge) profile of a battery according to an embodiment of the present invention.

FIG. 11 is a graph showing a cycle test result of a battery according to an embodiment of the present invention in terms of a discharge capacity and a coulombic efficiency.

FIG. 12 is a graph that analyzed a discharge capacity ratio of a battery according to an embodiment of the present invention depending on a stepwise increase and decrease of a discharge rate.

FIG. 13 is a graph that analyzed a discharge capacity ratio of a battery according to an embodiment of the present invention at various cycle rates.

FIGS. 15A and 15B show a single TEM image (a) and a EDX element analysis (b) of a delithiated nanowire exfoliated from a graphene foam.

FIG. 16B shows SEM images after a SEI layer is removed in FIG. 16a.

DETAILED DESCRIPTION

Unless otherwise defined, all technical and scientific terms used herein have the same meanings as commonly understood by an expert skilled in the technical field to which the present invention belongs. In general, the nomenclatures used in this specification are well known and commonly used in the art.

The present invention provides a novel electrode structure for a secondary battery capable of suppressing formation of an unstable SEI layer on an anode material by introducing the concept of 'electric potential control', which completely deviates from the concept of a sheath that spatially blocks the anode material introduced in the prior art.

The electrode structure for the secondary battery according to the present invention is characterized by comprising a potential sheath of electrical conductivity that separates an electrolyte into an external electrolyte in contact with a cathode and an internal electrolyte in contact with a nanostructure; and the nanostructure formed on a surface of the potential sheath on which the internal electrolyte is located, wherein a potential difference is formed on a surface of the potential sheath on which the external electrolyte is located when the battery is charged.

In the present invention, for the sake of convenience, the surface of the potential sheath on which the internal electrolyte is located may be referred to as an "internal surface" or an "inner surface" and the surface of the potential sheath on which the external electrolyte is located may be indicated as an "external surface" or an "outer surface".

Specifically, a difference between the electrode structure according to the present invention and the electrode structure using the conventional nanowire will be described with reference to FIGS. 1A, 1B, 1C, and 1D.

Figure 1A:
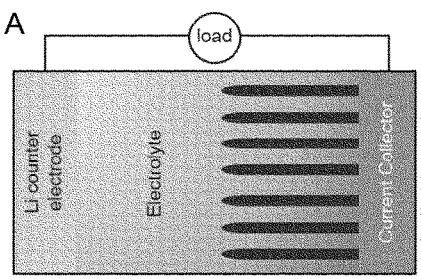
FIGS. 1A, 1B, 1C and 1D show a comparison between electrode structures (1A and 1C) using the conventional nanowire and electrode structures (1B and 1D) according to the present invention.
Figure 1B:
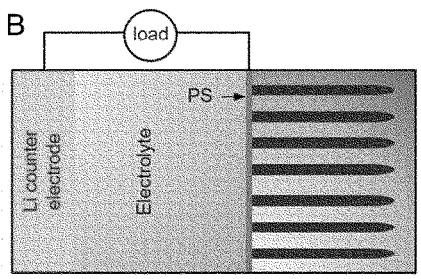
Figure 1C:
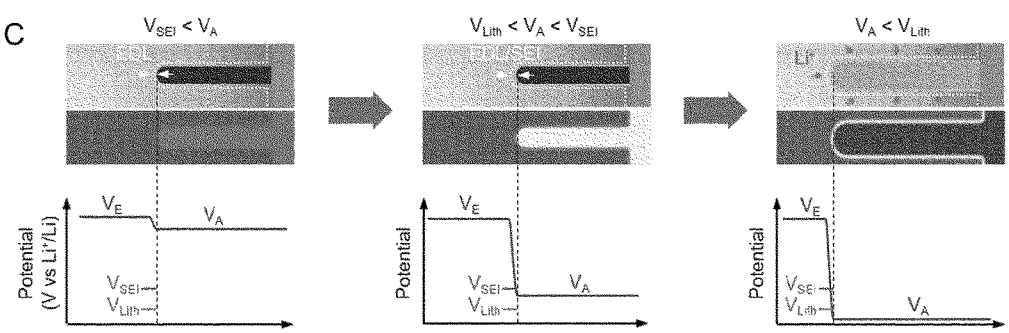

FIGS. 1A and 1C are schematic diagrams of a potential during first charging of a half-cell in which an electrolyte and a general nanowire (NW) anode are formed on a current collector. At the beginning of charging ($V_{SEI}<V_A$), a thin electrical double layer (EDL) occurs in an organic electrolyte near a working electrode, and most of the potential changes occur in this section. If the working potential ($V_A$) of the anode is substantially lower than the SEI layer-formed potential ($V_{SEI}$) ($V_{Lith}<V_A<V_{SEI}$), the electrons are transferred from the anode to the electrolyte and become a LUMO level. This process causes reductive decomposition of the electrolyte and creates the SEI layer on a surface of the anode. If the $V_A$ further decreases below the lithiation potential ($V_{Lith}$) ($V_A<V_{Lith}$), lithiation and parallel expansion occur in the nanowire anode. In this case, the SEI layer on the surface of the nanowire also expands together, but is reduced back to its original size by subsequent delithiation. During a cycle, the SEI layer also undergoes repetitive cracking and regeneration due to the periodic expansion and contraction of the nanowire. This causes continuous accumulation of the SEI layer, consumption of the electrolyte and failure of the anode, and becomes a major cause of decrease in the capacity as the number of cycles increases.

In order to overcome the fundamental limitation caused by the instability of the SEI layer, the present invention proposes a new electrode structure that prevents the SEI layer from being formed on the surface of the nanostructured active anode that repeats the expansion and contraction.

FIG. 1B is a schematic diagram of an example of an electrode structure according to the present invention. In FIG. 1B, the electrolyte is spatially and potentially separated by a thin wall of the potential sheath (P S). In addition, a nanowire anode active material of high density is rooted on the inner surface of the potential sheath. The potential sheath is thin enough to allow a lithium ion to pass through at $V_A<V_{Lith}$, and is electrically conductive so as to exert electrical shielding function and conductivity of the electrode.

Figure 1D:
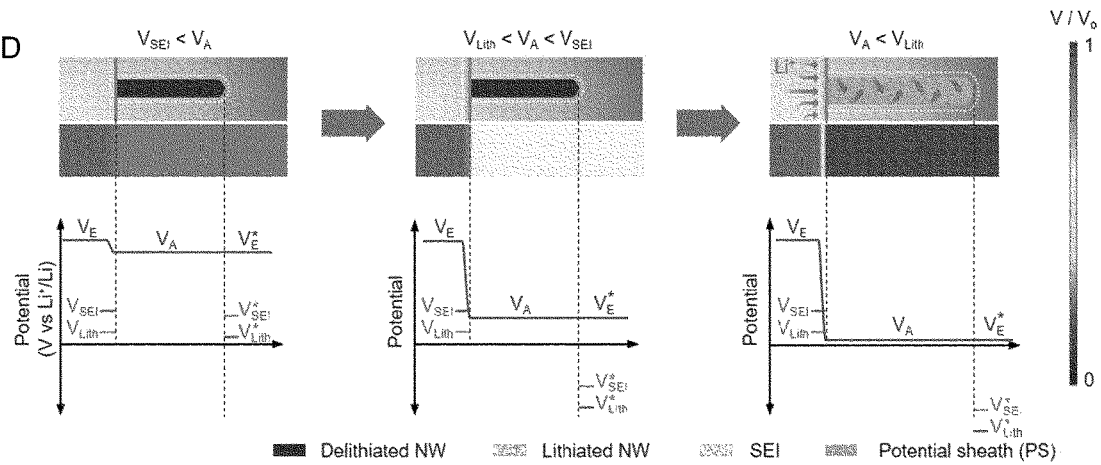

In the electrode structure of the present invention, a relative potential difference between the electrode and the electrolyte within a space enclosed by the potential sheath is kept constant. In FIG. 1D, even if the working potential of the anode becomes lower than the lithiation potential ($V_A<V_{Lith}$), a SEI potential (i.e., $V_{SEI}$) across the interface between the electrolyte and the anode inside the potential sheath is always kept lower than the $V_A$, and thus, the SEI layer is formed only on the outer surface of the potential sheath without being substantially formed on the surface of the nanowire. The nanowires having not the SEI layer can easily withstand a change in volume, and do not cause any problems associated with the unstable SEI layer. Therefore, the electrode structure of the present invention can still maintain a high capacity even after a number of cycles, and enables fast ion exchange.

Further, the electrode structure according to the present invention can still maintain an excellent cycle characteristic and a high capacity even if nanoscale defects occur in the potential sheath. This is in contrast to the fact that the stability of the anode structure having the conventional nanostructure is greatly destroyed even with the nanoscale defects. In case of the electrode structure of the present invention, even if cracks occur in the potential sheath, a major potential difference is still formed on the surface of the potential sheath to create the SEI layer on the surface of the potential sheath, and the potential difference between the nanostructure and the internal electrolyte, which is generated by the cracks of the potential sheath, is not enough to form the SEI layer. In addition, since the EDL and SEI layers generated on the surface of the potential sheath can cover small cracks generated in the potential sheath, they have the feature that can return back to an ideal electrode structure.

Accordingly, the present invention provides the electrode structure for the secondary battery comprising the potential sheath of electrical conductivity that separates the electrolyte into an external electrolyte in contact with a cathode and an internal electrolyte in contact with a nanostructure; and the nanostructure formed on the internal surface of the potential sheath, wherein a potential difference is formed on the external surface of the potential sheath when the battery is charged.

According to the present invention, it is preferable to use a material having an electric conductivity so that the potential sheath has a sufficiently thin thickness to allow the lithium ion to pass therethrough and serves as the electrode. Preferably, the potential sheath may be made of a graphene or a conductive polymer film.

Preferably, the potential sheath may use a graphene structure. The graphene structure preferably include a graphene foam having a continuous three-dimensional network. The graphene or the graphene structure has excellent conductivity and ion-permeability, and has a thickness of an atomic unit so that it is thin, easily bent and can be efficiently applied as a hard support.

The electrode structure of the present invention may preferably be an anode structure. In this case, the nanostructure is composed of a material capable of receiving/releasing an ion during charging and discharging of the secondary battery. For example, in case the nanostructure is used as the anode material for the lithium secondary battery, it may include a material capable of receiving/releasing the lithium ion. Such a material may, for example, include a silicon (Si), a lithium (Li), a germanium (Ge), a tin (Sn), an indium (In), $SnS_2$, $SnO_2$, $Fe_2O_3$, and the like. In particular, in case of the silicon (Si), the lithium ion may have an excellent receipt/release characteristic. When the lithium battery is charged, the lithium ion may move from a cathode to an anode. In this case, the nanostructure may play a role of accommodating the lithium ion. The receipt of the lithium ion by the anode may be referred to as lithium intercalation or lithiation. When the lithium battery is discharged, the lithium ion may move from the anode to the cathode. It this case, the nanostructure may serve to release the lithium ion. The release of the lithium ion by the anode may be referred to as lithium deintercalation or delithiation.

The graphene may also contribute to the lithium intercalation and the lithium deintercalation, but a ratio of the lithium intercalation and the lithium deintercalation by the nanostructure may be much larger than that by the graphene. Accordingly, as a plurality of nanostructures are provided, the capacity of the secondary battery can be greatly increased.

According to a preferred embodiment of the present invention, the nanostructure that can be used as the anode material is preferably a silicon-based anode material from the viewpoint of the capacity, and it is more preferably a nickel silicide (NiSi) nanostructure. The nickel silicide not only has a high capacity and excellent discharge capacity ratio, but also has the advantage of being able to grow at a low temperature (~450° C.) in the presence of Ni and Si precursors. The NiSi has a gravimetric capacity of about 1300 mAhg$^{-1}$, which is lower than Si, but much higher than the graphite. The NiSi also exhibits a specific resistance of about 10 μΩcm in a single crystal state, and thus has an additional advantage of excellent conductivity.

In the present invention, the nanostructure is preferably a nanowire.

FIG. 2 shows an exemplary anode structure of the present invention. The anode structure of FIG. 2 has a structure in which the nanowire of high density is formed on the inner surface of a continuous three-dimensional micro-tubular structure of a graphene foam. In the above structure, the graphene shell serves as a potential sheath. Upon charging, an SEI layer is formed on the surface of the graphene shell, but is not formed on the nanowire inside the graphene foam, and thus, a change in volume can be easily withstood.

A method for manufacturing the anode structure of FIG. 2 will be described with reference to FIG. 3. In order to manufacture the anode structure of the present invention, a template foam is prepared first. The template foam is used as a base for growing the graphene foam, while being used as a seed material for growing the nanowire. The template foam may be made of a suitable material depending on a type of the nanostructure that will formed inside the graphene foam. In case the nanostructure of nickel silicide is formed, a nickel foam may be used as the template foam. If the template foam is prepared, the graphene foam structure is manufactured by forming a graphene layer on the surface. In this case, the graphene layer may be formed according to a process generally used in the art.

For example, the graphene foam structure may be formed by a CVD (chemical vapor deposition) method using a gas source. The gas source may be a gas containing a carbon. As an example, the gas source may include $CH_4$. Further, $H_2$ gas and Ar gas may be further used together with the $CH_4$ gas. The CVD method may be performed at a temperature of about 700° C. or higher, for example, about 1,000° C. A thickness of the graphene layer and an inner size of the graphene foam structure to be formed may be adjusted depending on a supply time of the gas source (e.g., $CH_4$).

As another example, the graphene foam structure may be made by forming a carbon-containing layer on the surface of the template foam and then heat-treating the carbon-containing layer. The carbon-containing layer may be a precursor of the graphene layer. In other words, the carbon-containing layer may be referred to as a solid carbon source for forming the graphene layer. For example, the carbon-containing layer may be made of a carbon-containing polymer or an amorphous carbon (a-carbon). As the carbon-containing polymer, a polymer of any structure and composition containing the carbon may also be used. The carbon-containing polymer may be a self-assembled polymer or a general polymer without the self-assembly property. The carbon-containing polymer may include, for example, at least one of an amphiphilic polymer, a liquid crystal polymer, and a conductive polymer. The carbon-containing polymer may be applied on the surface of the template foam by various methods such as a solution process, a gas process, and the like. In case of the a-carbon, it may be applied on the surface of the template foam by, for example, a PECVD (plasma enhanced chemical vapor deposition) method. After the carbon-containing layer is formed, the graphene foam structure may be made by heat-treating the carbon-containing layer. The heat treatment may be performed at a temperature of, for example, about 400 to 2,000° C., by various methods such as a RTA (rapid thermal annealing) and a laser annealing.

If the graphene layer is formed, the graphene foam structure is made by removing the template foam inside the graphene layer using a method such as etching. The etching may be performed by immersing the template foam in an etching solution such as a sulfuric acid, a hydrochloric acid, or an iron chloride.

In this case, it is important to note that the template foam is not completely removed, but a part thereof remains inside the graphene foam to serve as a seed through which the nanostructure can be formed. In order to retain a suitable amount of the template foam, it is required to control an etching time, a temperature, or a weight ratio of the graphene and the seed material.

For example, in case a nickel foam is used as the template foam and a nickel silicide is used as the nanostructure, it is preferable to control the nickel to have a weight of 4 to 10 times compared to the graphene by deriving an etching rate of 0.1 to 0.5 mg per minute for the nickel enclosed with the graphene. In the other aspect, the weight of nickel remaining on the inner surface of the graphene foam is preferably 0.1 to 1.0 mg/cm$^2$, more preferably 0.3 to 0.7 mg/cm$^2$.

Further, it is preferable that the etching of the template foam further includes a step of immersing the template foam in ethanol, methanol, acetone, etc. before immersing the template foam in the etching solution. If the template foam is immersed in ethanol and then immersed in the etching solution, it is possible to prevent a phenomenon that the template foam is not uniformly etched by creating air condensation inside the template foam due to a surface tension of the etching solution so that the template foam is not safely immersed in the etching solution. Therefore, after the surface of the template foam is coated with ethanol having a low surface tension first, it is preferable to completely immerse the template foam in the etching solution.

If the template foam is removed to form the graphene foam, the step of completely drying the graphene foam and then forming a nanostructure therein is performed. The formation of the nanostructure inside the graphene foam may achieved by growing a plurality of nanostructures with, for example, a CVD method, using a gas source. As a concrete example, a silicon-based nanostructure may be formed by the CVD method using $SiH_4$ or $SiCl_4$ as the gas source, and a germanium-based nanostructure may be formed by the CVD method using $GeH_4$ as the gas source.

In case of forming nickel silicide as the nanostructure, the nickel silicide nanostructure can be formed inside the graphene foam by the CVD method using a silane gas. In this case, the nickel remaining inside the graphene foam acts as a seed, so that the nickel silicide can grow only inside the graphene foam.

The electrode structure manufactured by the method of the present invention exhibits very excellent cycle performance that is difficult to predict from the conventional nanowire anode in virtue of the synergistic effect of the graphene foam-potential sheath and the nickel silicide nanowire anode active material. This is because the SEI layer occurs only on the outer surface of the graphene-based potential sheath and the nanowire without the SEI layer allows very fast electron/ion transmission and volume change.

According to an embodiment of the present invention, it was confirmed that the electrode structure of the present invention exhibits a very high specific capacity of 702 $mAhg^{-1}$, which corresponds to 84% of the initial capacity, after cycles of 2,000 times at 20 C, and maintains an extremely excellent discharge capacity ratio of 88% at 80 C.

FIG. 4 shows a method for manufacturing another exemplary electrode structure of the present invention.

In the above method, a gold nanoparticle is applied on a graphene substrate synthesized by the CVD method using an Au-colloid drop coating, a vacuum thin film deposition, an electroplating, etc., and a silicon nanowire is grown using the Si CVD method as described above. On the other hand, after a metal current collector is patterned using SU-8 or AAO and a spacer is applied on the metal current collector, the graphene on which the silicon nanowire is grown and the current collector on which the spacer is applied can be bonded with each other to form an electrode.

In the above electrode structure, the graphene acts as a potential sheath to suppress the formation of the SEI layer on the surface of the silicon nanowire active material located therein.

Figure 5A:
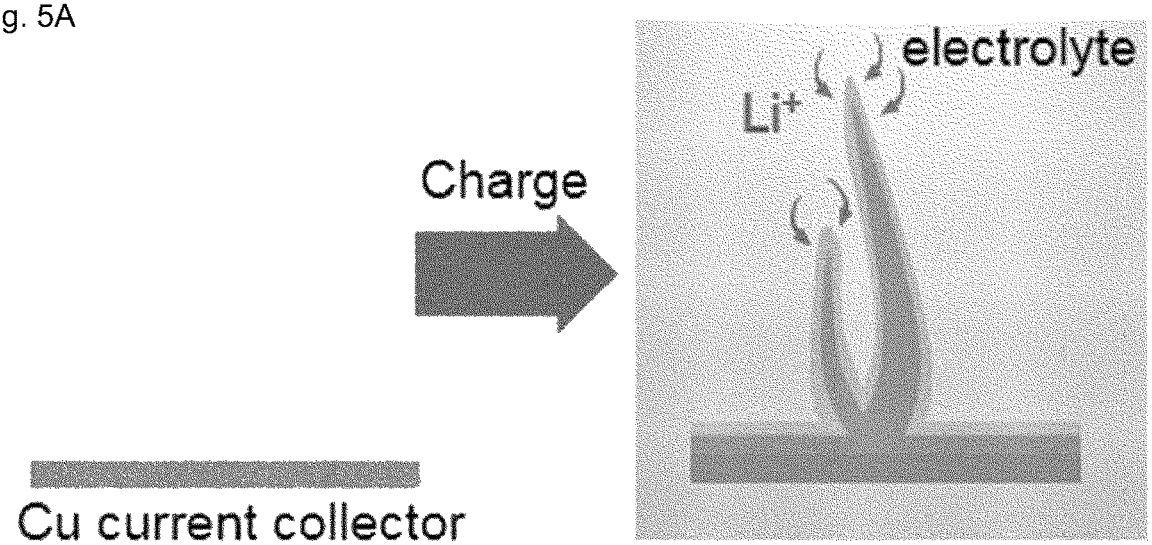
FIGS. 5A and 5B show a method for manufacturing a still another exemplary electrode structure of the present invention.
Figure 5B:
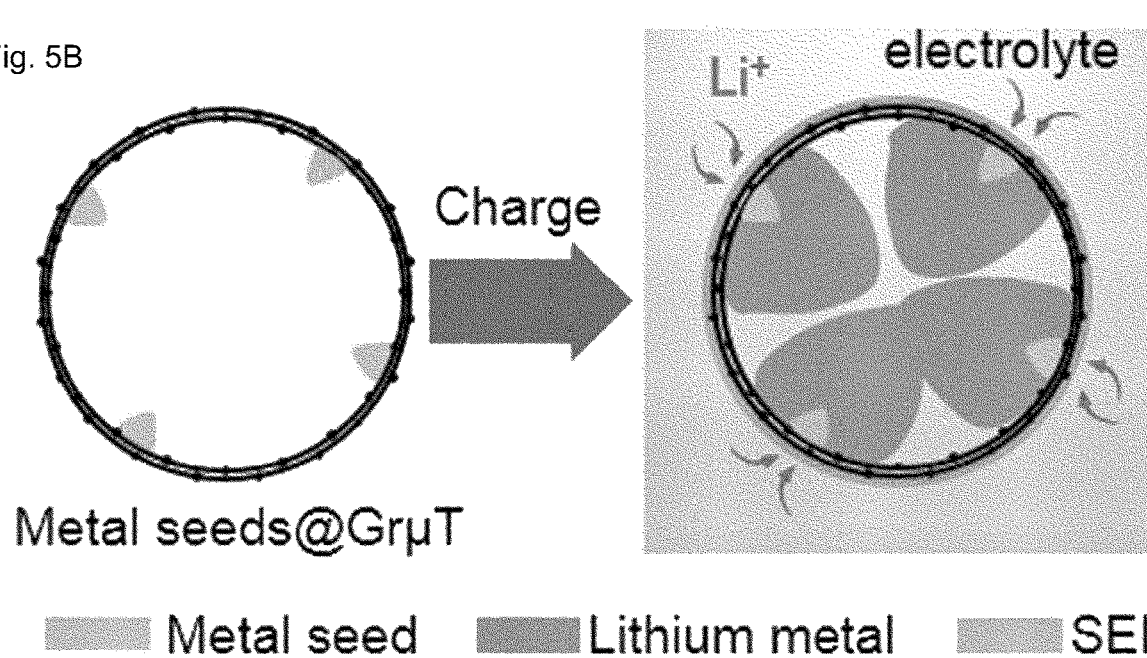

FIGS. 5A and 5B shows another exemplary electrode structure of the present invention. As shown in FIG. 5A, if charging is performed using a copper current collector or a lithium metal as the anode material, the lithium metal grows in a dendrite form, and the SEI layer is created on a surface of the dendrite.

However, as shown in FIG. 5B, if the anode structure is manufactured by putting a gold catalyst into the graphene foam, since the lithium generated during charging is selectively deposited only on the gold catalyst inside the graphene foam and the SEI layer is formed outside the potential sheath, the electrode structure having an excellent cycle characteristic and capacity can be manufactured.

The electrode structure according to the present invention can be used as an anode in the secondary battery, and is particularly applied to a lithium secondary battery, which can be used as the anode material having the excellent cycle characteristic and the discharge capacity.

EXAMPLES

Hereinafter, the present invention will be described in more detail through Examples. Since these Examples are for illustrative purposes only, it will be apparent to a person who has an ordinary knowledge in the art that the scope of the present invention is not to be construed as being limited by these Examples.

Preparation Example 1: Preparation of Graphene Foam-Nickel Silicide Nanowire Electrode A Ni foam (MTI Korea) of high purity having a thickness of 1 mm was cut into a coin shape using a punching machine. The nickel foam was loaded into a CVD reaction chamber to synthesize a multi-layered graphene on a surface of the nickel foam. The reactor was vacuumed with $5\times10^{-3}$ Torr and heated to 1,000° C. After the nickel foam was annealed under an atmospheric pressure of $H_2$/Ar for 30 minutes, a gas mixture containing $CH_4$ of 30% diluted in $H_2$ and Ar was injected into the reactor to induce an initial growth of the graphene. After exposure to the precursor gas mixture for 2 minutes, the reactor was vacuumed again and immediately cooled to a room temperature. As the surface of the nickel foam was uniformly coated with the multi-layered graphene, a change in color was observed.

The sample was completely immersed in ethanol to coat a surface thereof with ethanol, and then immersed in a Ni etching solution (UN2796 sulfuric acid, Transene Company, Inc.) for 2.5 hours so that only a trace amount of nickel remained in the graphene coating (0.45 $mg/cm^2$).

The sample was washed three times in a deionized water and completely dried in an oven of 70° C. After drying, the sample was loaded into a silicon CVD reactor to grow a nickel silicide nanowire (NiSiNW). The nickel silicide nanowire was selectively grown inside the graphene foam due to the presence of a current Ni in the graphene foam. A $SiH_4$ gas mixture of 10% diluted in $H_2$ was injected at a flow rate of 50 sccm, and a temperature and a pressure of the reactor were maintained at about 460° C. and 20 Torr. The growth was completed after approximately 20 minutes.

For Comparative Example, the nickel silicide nanowire was directly grown on the nickel foam using the same conditions of the Si CVD process.

Figure 6A:
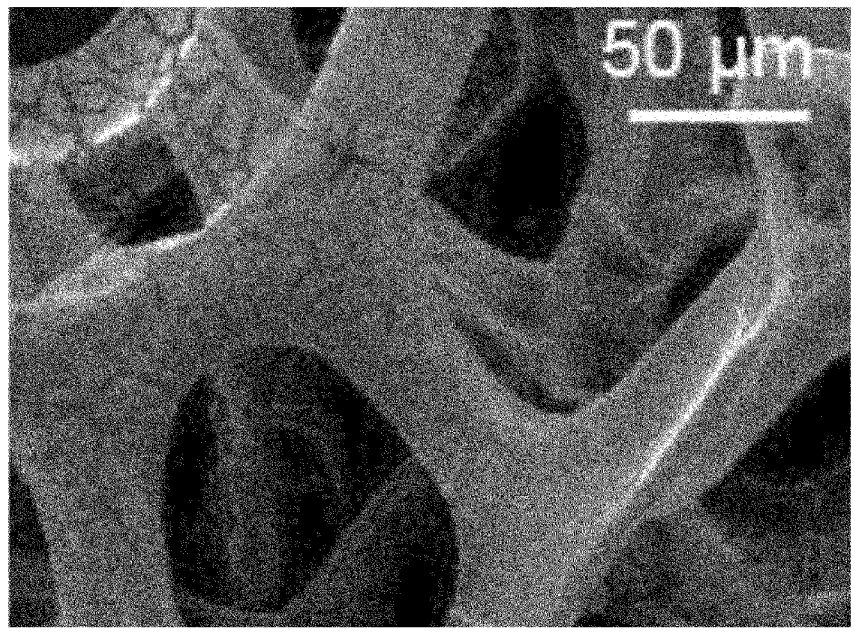
FIG. 6A shows a SEM (scanning electron microscope) image of an electrode structure manufactured according to an embodiment of the present invention.

Experimental Example 1: Analysis of Structural Properties of Electrodes Analysis of SEM Image A FE-SEM image of the prepared sample was measured using JSM-7600 (JEOL) of 15 kV, and was shown in FIG. 6A. It could be seen that a shape of the sample was similar to that of the initial nickel foam.

Figure 6B:
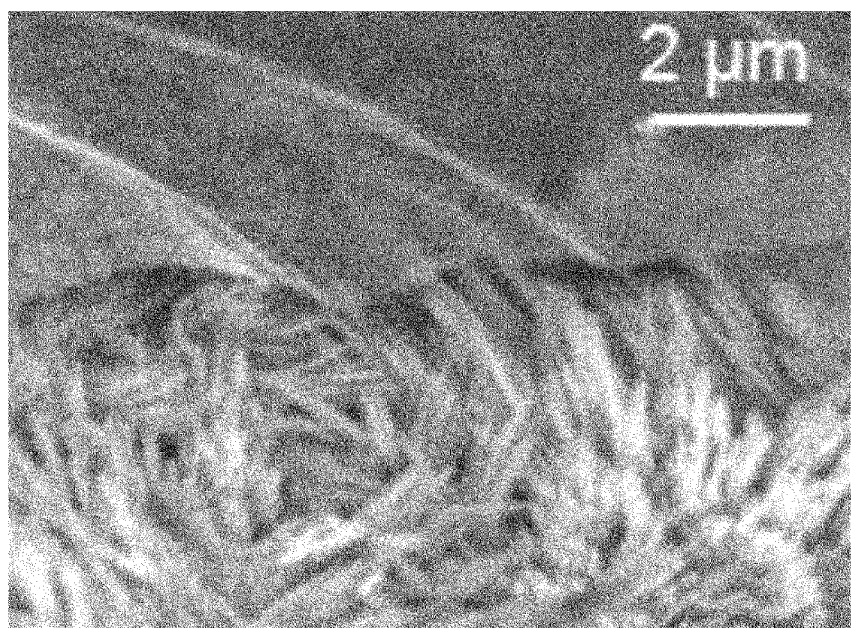
FIG. 6B shows an internal SEM image in which an electrode structure according to the present invention is cut.

FIG. 6B is an internal SEM image measured by freezing the sample with a liquid nitrogen and then cutting it. A very thin tubular graphene wall and a nanowire of high density were observed. Typically, a diameter of the graphene foam was 40 to 60 μm, and a diameter and a length of the nanowire were about 8 to 10 nm and 80 to 150 nm.

Analysis of TEM Image

A TEM image of the single nanowire was measured using JEM-2100F (JEOL) equipped with EDS.

Figure 7A:
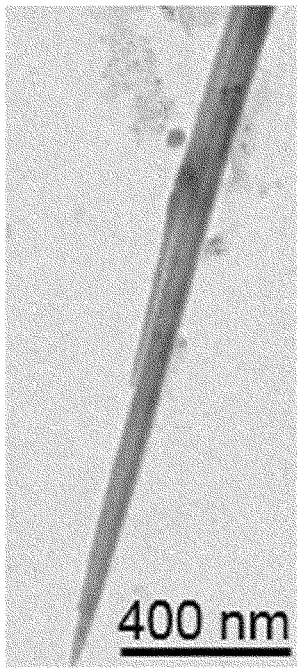
FIG. 7A shows a TEM (transmission electron microscope) image of a nanowire according to an embodiment of the present invention.
Figure 7B:
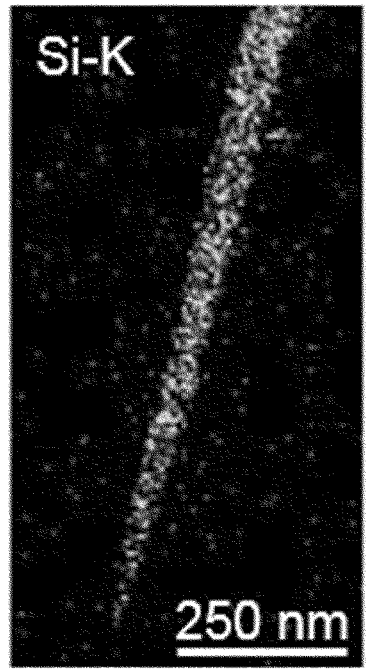
FIGS. 7B and 7C show an image of analyzing an EDX composition of a nanowire according to an embodiment of the present invention.
Figure 7C:
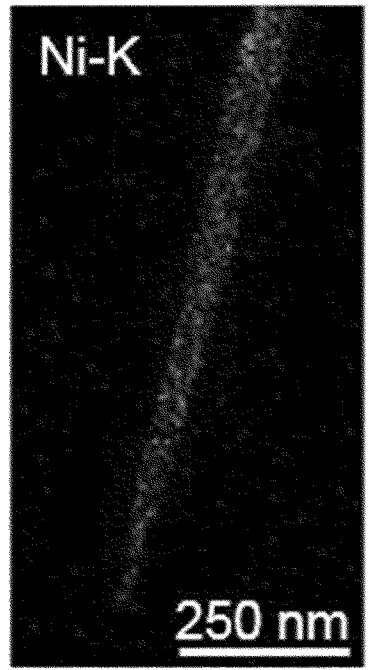

FIG. 7A shows the TEM image of the single nanowire, and FIGS. 7B and 7C show an analysis image of an EDX composition. By the analysis of the EDX composition, it could be confirmed that the Ni and Si elements were uniformly distributed in an atomic ratio of almost 1:1.

Figure 8A:
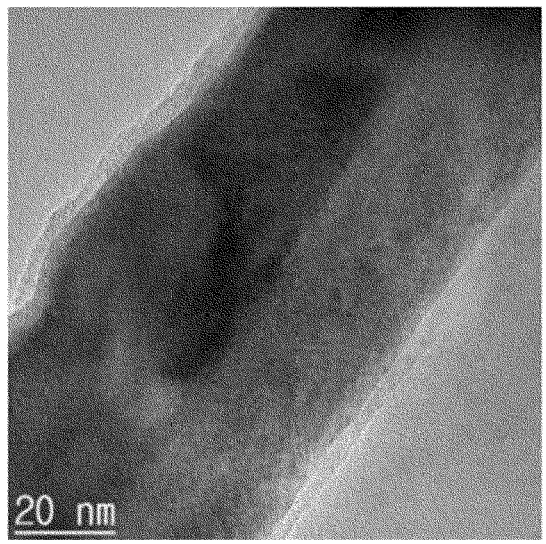
FIG. 8A shows a high-resolution TEM image of a nanowire according to an embodiment of the present invention.
Figure 8B:
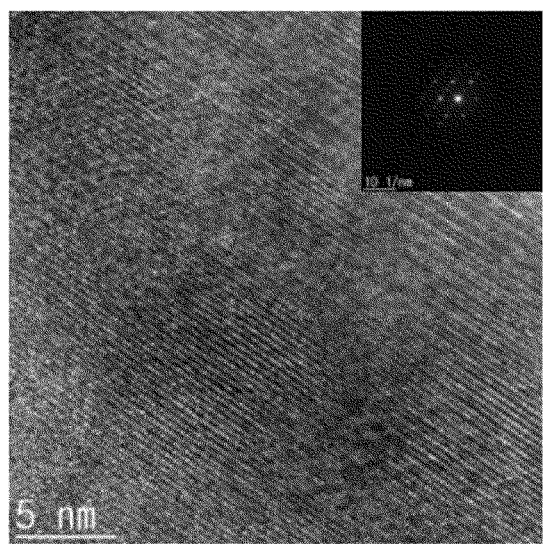
FIG. 8B shows a SAED (selected area electron diffraction) pattern image of a nanowire according to an embodiment of the present invention.

FIGS. 8A and 8B show a TEM image and a SAED (selected area electron diffraction) pattern image of high resolution, respectively. From the above images, it could be seen that the nanowire had a single crystal structure of a NiSi core.

Experimental Example 2: Electrochemical Performance Analysis of Electrode

In order to analyze an electrochemical performance of the electrode prepared by Preparation Example 1, the electrode was assembled into a half-cell of a coin shape (CR2032) in a glove box filled with an argon gas.

A lithium foil was used as a counter electrode, and the interior of the half-cell was filled with $LiPF_6$ of 1.0 M in ethylene carbonate/diethylene carbonate (EC/DEC, 1:1 vol. %).

Analysis of CV Profile

CV (cyclic voltammetry) profile was measured for scans of 1 times, 3 times, 5 times and 7 times at a scan rate of 0.1 mV/s between 0 V and 2 V using an electrochemical workstation (IVIUM-n-STAT), and was shown in FIG. 9.

FIG. 9 indicated that the peaks of 0.1 V and 0.22 V in the cathode scan and the peak of 0.27 V in the anode scan corresponded to lithiation and delithiation of the nickel silicide nanowires, respectively, and that current densities increased after the scan. In contrast, the peak of 1.4 V in the cathode scan were gradually decreased during the scan.

Analysis of GCD Profile

FIG. 10 shows the results of measuring a GCD (galvanostatic charge-discharge) profile of the half-cell of the coin shape for cycles of 1 times, 10 times, 20 times, and 100 times using a TOSCAT 3000 battery tester (TOSCAT 3000, Japan).

From FIG. 10, a slightly flat graph was observed at a point of 1.4 V upon charging. This flat graph almost disappeared after the cycle of 10 times. Considering a decomposition potential (LUMO level) of the used electrolyte (about 1.3 to 1.4 V vs Li+/Li for $LiPF_6$ of 1 M in EC/EDC), the flatness at 1.4 V was thought to be related to the formation of the SEI layer. The rapid disappearance of this flatness for the initial cycles of several times means that the SEI layer was stabilized fast.

Once the anode was stabilized, there was little change in the charge/discharge profile after the cycles of 100 times at 10 C, and the charge/discharge capacity was maintained above 900 $mAhg^{-1}$.

Analysis of Cycle Stability

In order to further analyze the performance of the electrode structure of the present invention, a charge/discharge cycle test was performed at 10 C and 20 C for the cycles of 2,000 times or more. A discharge capacity and a coulumbic efficiency were plotted as a function of cycle number and were shown in FIG. 11. For comparison, a nickel silicide nanowire (NiSiNWs-on-NiF) electrode grown on a nickel foam was tested at 2 C, which is a much slower cycle rate.

FIG. 11 indicated that after the cycles of 100 times, the nanowire anode formed on the nickel foam underwent a significant capacity reduction of about 33%, while the graphene foam-nickel silicide nanowire (NiSiNWs@GrμT) anode of the present invention had excellent performance and cycle stability.

Excluding the capacity reduction up to the initial cycles of 20 times, the anode of the present invention exhibited a very excellent capacity retention rate of 702 $mAhg^{-1}$, which reaches 90% at 10 C and 84% at 20 C after the cycles of 2,000 times.

Analysis of Discharge Capacity Ratio

Considering that a change in the charge and the discharge rate can accelerate deformation of the structure of the electrode material, a discharge capacity ratio is another important factor for high power operation.

The discharge capacity ratios of the graphene foam-nickel silicide nanowire (NiSiNWs@GrμTs) electrode of the present invention and the nickel foam-nickel silicide nanowire (NiSiNWs-on-NiF) electrode were analyzed by repeating a series of experiments that the discharge rates of the two electrodes were increased and decreased stepwise from 1 C to 20 C (1 C, 2 C, 5 C, 10 C and 20 C; cycles of 10 times at each rate).

FIG. 12 indicated that, even though the discharge rate was increased by 20 times from 1 C to 20 C, the electrode according to the present invention maintained the highest capacity of 91% at 1 C. On the other hand, a sudden corrosion was observed from the nickel foam electrode as the discharge rate and the cycle number increased. The nickel foam electrode showed a low capacity of 270 $mAhg^{-1}$ at 10 C, which is nothing but about 34% of the electrode of the present invention.

More importantly, the electrode of the present invention exhibited a very excellent discharge capacity ratio under harsher cycle conditions that the discharge rate of the electrode was repeatedly increased and decreased stepwise from 1 C to 20 C, and further from 1 C to 80 C.

FIG. 13 showed that the anode of the present invention had a capacity of 800 $mAhg^{-1}$ or more at 40 C, and 780 $mAhg^{-1}$ or more at 80 C, which maintained a level of about 90% of the capacity at 1 C.

The literatures have hardly reported the results of analyzing the cycle performance under the harsh cycle conditions exceeding 10 C. Therefore, the capacity of 780 $mAhg^{-1}$ at 80 C is an extremely excellent result.

Experimental Example 3: Morphological Analysis Before/after Charting

Figure 14A:
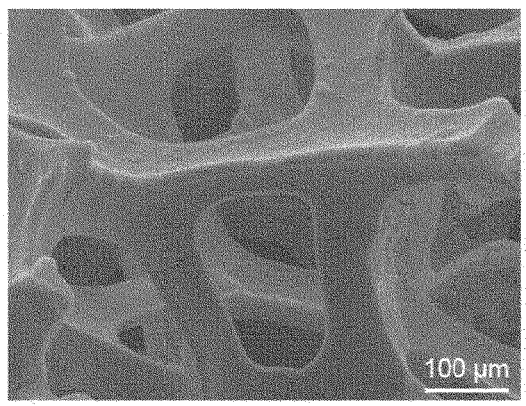
FIGS. 14A, 14B and 14C show SEM images of a graphene foam and a delithiated nickel silicide nanowire after a cycle.
Figure 14B:
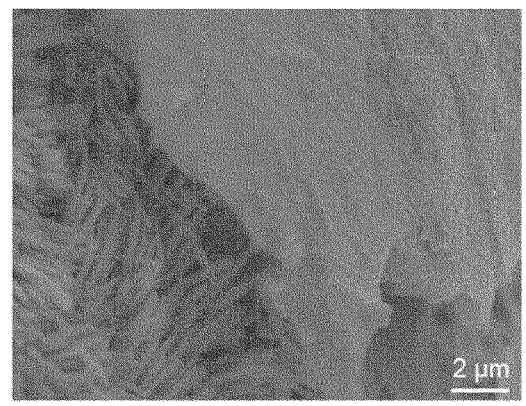
Figure 14C:
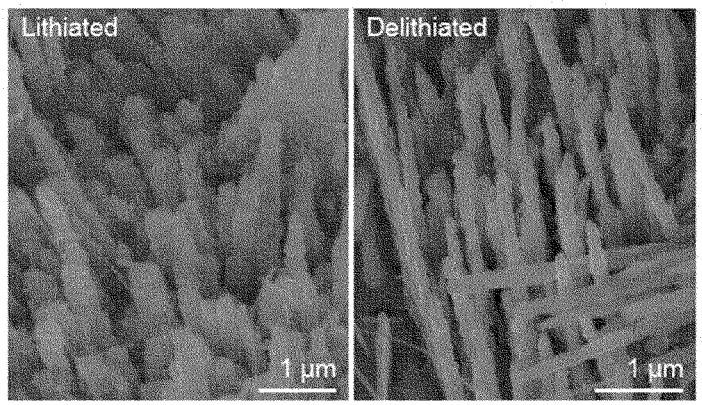

SEM images of the graphene foam and the delithiated nickel silicide nanowire after the cycle were shown in FIGS. 14A, 14B and 14C.

It was confirmed from FIG. 14B that the SEI layer was selectively formed on the outer surface of the graphene foam.

It could be seen from FIG. 14C that after regeneration, the nanowires mostly retained their original shapes and sizes, although they had rough surfaces. The lithiated nanowire showed an increase of about 190% in a diameter compared to the delithiated nanowire.

Further, a single TEM image of the delithiated nanowire exfoliated from the graphene foam was shown in FIG. 15A. The nanowires exhibited a multi-crystalline core and an amorphous shell, which were identified as NiSi and $SiO_x$ ($NiO_x$), respectively, by an EDX element analysis (FIG. 15B). P and F related to the components of the SEI layer were hardly detected in the nanowire.

Figure 16A:
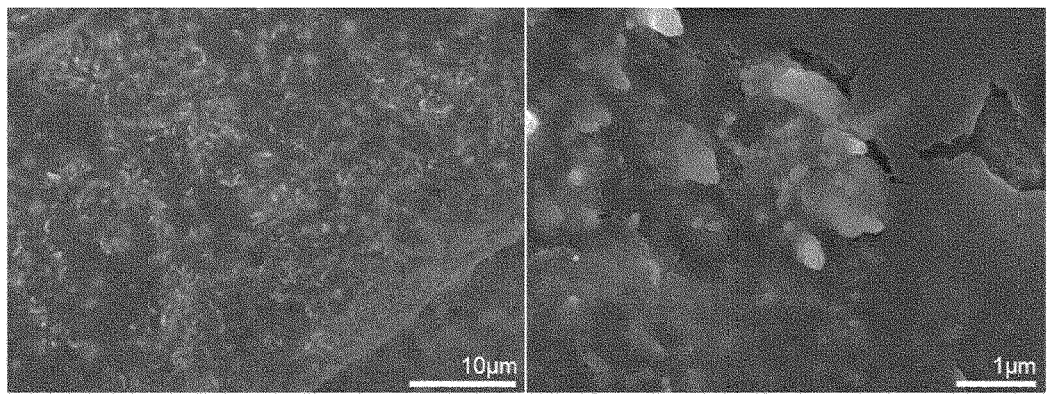
FIG. 16A shows SEM images of a nickel silicide nanowire grown on a nickel foam after cycles of 100 times.
Figure 16B:
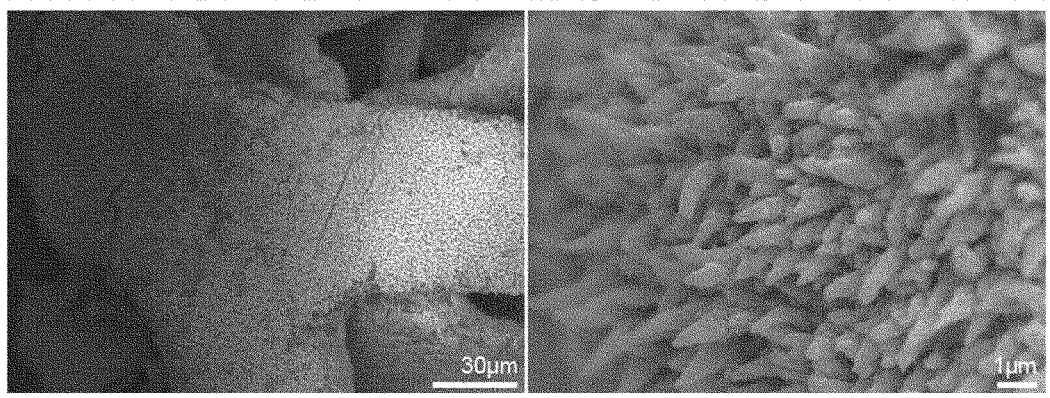

The SEM image of the nickel silicide nanowire grown on the nickel foam after the cycles of 100 times was shown in FIG. 16A. After the cycles of 100 times, all the nanowires were buried in the thick SEI layer, and only the shapes of the individual nanowires could be identified after the SEI layer was removed with acetonitrile as shown in FIG. 16B.

As described above, concrete parts of the contents of the present invention have been described in detail. It will be obvious to a person who has an ordinary knowledge in the art that these concrete descriptions are only preferred embodiments, and the scope of the present invention is not limited thereto. Accordingly, it will be said that the practical scope of the present invention is defined by the appended claims and their equivalents.

What is claimed is:

1. A method for manufacturing an electrode for a secondary battery, comprising the steps of:
   (a) preparing a template foam;
   (b) coating a graphene on the template foam;
   (c) removing the template foam to form a graphene foam, wherein the template foam partially remains on an internal surface of the graphene foam; and
   (d) growing a nanowire by using the template foam remaining on the internal surface of the graphene foam as a seed.

2. The method for manufacturing the electrode for the secondary battery according to claim 1,
   characterized in that the step (b) is carried out by a chemical vapor deposition using a carbon as a source gas.

3. The method for manufacturing the electrode for the secondary battery according to claim 1,
   characterized in that the template foam is a nickel foam.

4. The method for manufacturing the electrode for the secondary battery according to claim 1,
   characterized in that the step (d) is carried out such that a silicon-based nanowire is grown by the chemical vapor deposition using a silicon-based source gas.

5. The method for manufacturing the electrode for the secondary battery according to claim 1,
   further comprising the step of immersing a graphene-coated template foam in ethanol, methanol or acetone before performing the step (c).

6. The method for manufacturing the electrode for the secondary battery according to claim 1,
   characterized in that the step (c) is carried out such that the template foam remains 4 to 10 times the weight of the graphene foam.

7. The method for manufacturing the electrode for the secondary battery according to claim 1,
   characterized in that the step (c) is carried out such that the template foam remains a weight of 0.1 to 1.0 mg/cm$^2$ on the internal surface of the graphene foam.

* * * * *